United States Patent [19]
Dorler et al.

[11] Patent Number: 4,508,981
[45] Date of Patent: Apr. 2, 1985

[54] DRIVER CIRCUITRY FOR REDUCING ON-CHIP DELTA-I NOISE

[75] Inventors: Jack A. Dorler, Wappingers Falls; Joseph M. Mosley, Hopewell Junction; Stephen D. Weitzel, Poughkeepsie, all of N.Y.

[73] Assignee: International Business Machines Corporation

[21] Appl. No.: 392,982

[22] Filed: Jun. 28, 1982

[51] Int. Cl.³ ............... H03K 3/013; H03K 19/003; H03K 17/16
[52] U.S. Cl. ................... 307/542; 307/303; 307/551; 307/559; 307/565
[58] Field of Search ............ 307/303, 542, 551, 555, 307/556, 559, 561, 565

[56] References Cited
U.S. PATENT DOCUMENTS

| 3,188,499 | 6/1965 | Xylander . |
| 3,506,844 | 4/1970 | Rohloff ............... 307/542 |
| 3,654,530 | 4/1972 | Lloyd . |
| 3,816,762 | 6/1974 | Holt, Jr. . |
| 3,898,482 | 8/1975 | Holt, Jr. . |
| 3,969,637 | 7/1976 | Minami et al. ............... 307/542 |
| 4,027,177 | 5/1977 | Davis . |
| 4,085,432 | 4/1978 | Varettoni . |
| 4,131,928 | 12/1978 | Davis et al. . |
| 4,178,521 | 12/1979 | Speth . |
| 4,216,393 | 8/1980 | Gillberg et al. . |
| 4,239,989 | 12/1980 | Brajder . |
| 4,398,106 | 8/1983 | Davidson et al. ............... 307/549 |

OTHER PUBLICATIONS

IBM Technical Disclosure Bulletin Publication entitled "ΔI Suppressor", by J. E. Gersbach, vol. 19, No. 1, Jun. 1976, p. 30.

Primary Examiner—John Zazworsky
Attorney, Agent, or Firm—Wesley DeBruin

[57] ABSTRACT

Compensation circuit means for inclusion in an off-chip driver circuit is provided to reduce self-induced switching noise in a multi-chip module semiconductor structure. A module section interconnects the chips and the chips have a power supply and power leads respectively. The compensation circuit means, which is coupled across the output transistor circuit of the off-chip driver, may comprise one or more serially connected diodes. The diode (or diodes) may be formed by the base collector junction of a bipolar transistor.

8 Claims, 6 Drawing Figures

FIG. 1 *PRIOR ART*

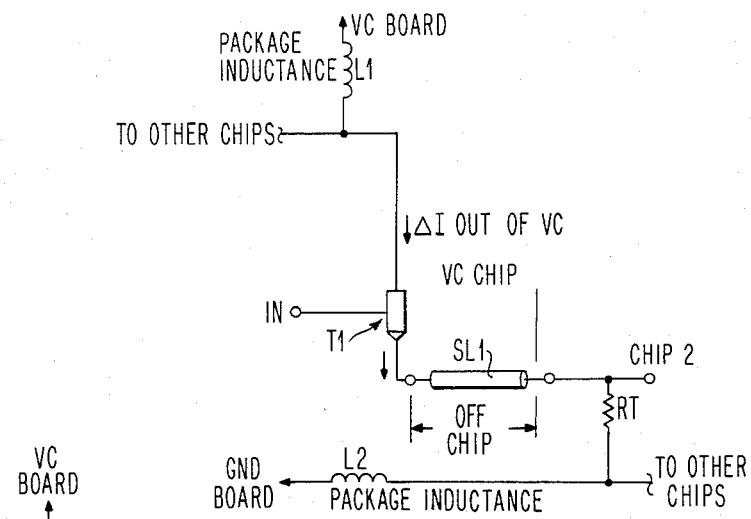
FIG. 3  *PRIOR ART*
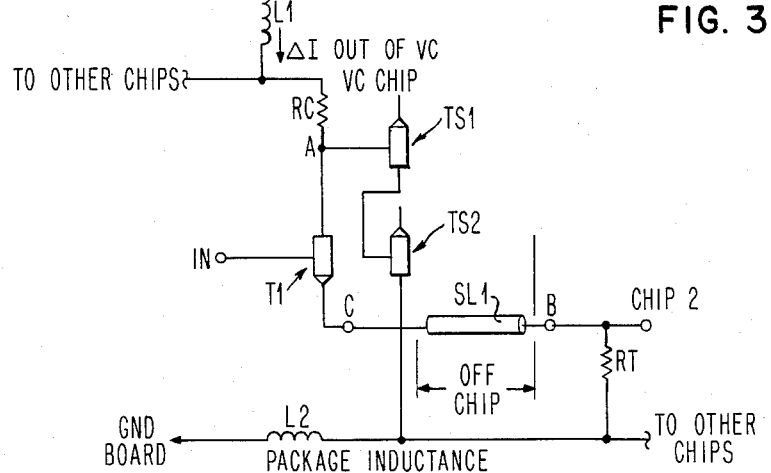
FIG. 4
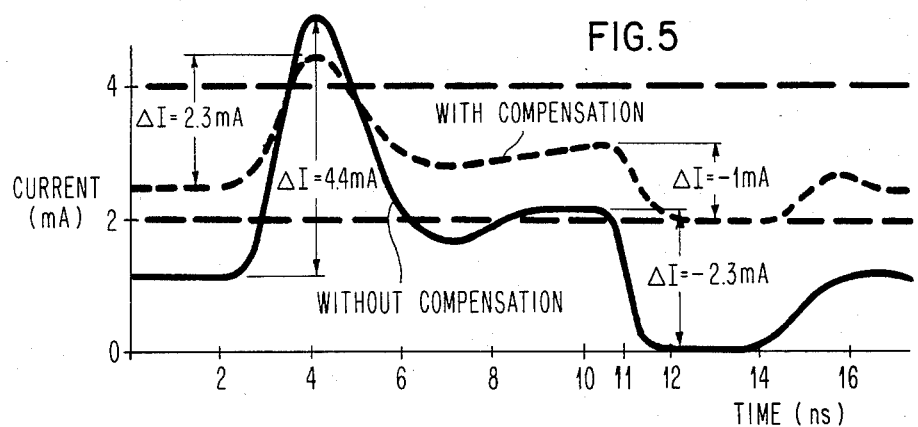

DRIVER CIRCUITRY FOR REDUCING ON-CHIP DELTA-I NOISE

DESCRIPTION

TECHNICAL FIELD

This invention relates to the reduction of switching noise caused by package inductance in computer circuits. In particular, the invention relates to driver circuitry for eliminating self-induced switching noise (Delta-I noise) caused by inherent package inductance in semiconductor chips.

BACKGROUND OF THE INVENTION

An important limitation in the advancement of packaging technology for higher performance in computer circuitry is the reduction of self-induced switching noise caused by inherent package inductances. This noise is generally known as Delta-I noise. Given constraints in today's multi-chip module (MCM) technology, there are nearly no degrees of freedom available for improvement in this area. Conventional noise flow in a chip can be considered in detail by reference to FIG. 1 which shows two communicating chips, "Chip 1" and "Chip 2" within a MCM. FIG. 1 shows Chip 1 utilized as a driver indicated by the Transistor T1 while Chip 2 is used as a receiver indicated by a terminating resistor, RT. A module section "module" interconnects the two chips and contains a signal line and two reference planes disposed on either side of the signal line. Two power vias disposed underneath each of the chip sites are coupled through large decoupling capacitances C10 and C11 on the board.

In operation, when the driver, Chip 1 switches on, that is T1 output goes high, current passes down the signal line to the terminator RT for the case where VC is positive with respect to GND. This current enters the GND via and travels down the module to the GND reference plane. FIG. 1 shows a fraction of the current passing back toward the sending chip while the remainder goes to the board through the decoupling capacitors C11 and back up to the Chip 2 VC reference plane. This is shown by the dotted line arrow in the righthand portion of FIG. 1.

When the VC reference plane current arrives at Chip 1, the current loop is completed by flowing through the driver. It should be noted, however, that the GND reference plane current must flow down to the board under Chip 1 and return through the VC via before it can complete its loop. This is shown in the lefthand lower portion of FIG. 1 by the dotted line arrow. When the C10 current merges with the C11 current, the board then experiences the full driver current. Also, it should be noted that even though the board capacitors are interconnected the return currents must and do flow through the reference planes in order to provide for a controlled characteristic impedance.

As shown in FIG. 1, all of the driver current must travel to the board to complete the current path. Accordingly, the effective package inductance is relatively high even in a system utilizing intramodule communication. Given the current paths of FIG. 1, a negative Delta-I noise component is introduced at the Chip 1 VC and a positive Delta-I noise component is introduced at the Chip 2 GND. When these noise components are present on the chip power supplies, they may propagate onto quiet lines potentially resulting in false switching of quiet receivers and may also disturb on chip logic gates.

Accordingly, an important consideration in reducing system susceptibility to noise is the ability to reduce the magnitude of the effective package inductance. Such a reduction produces a corresponding reduction in the magnitude of the noise component.

Given the noise current flow paths depicted in FIG. 1, one technique for reducing effective package inductance is to have the high frequency noise current circulate near the top of the module as opposed to traveling down to the board. Such a path would bypass most of the module and the board inductance. A potential technique for accomplishing this goal would be to introduce top surface module decoupling capacitors. However, within the limits of known technology, this solution is currently not feasible for use with practiced MCM techniques. Available decoupling capacitors are not compatible with existing MCM technology because excessive topside area would have to be set aside for their inclusion. This would reduce the number of chips and circuits that could be placed on the MCM significantly detracting from its overall performance and economic advantages. Furthermore, additional power planes would have to be added at the top of the MCM to provide a low inductance path between the capacitors and the chips making the module even more complex and more expensive to produce.

Therefore, an incentive remains to provide an on-chip virtual decoupling capacitor that may be synthesized within the existing chip technology.

Within the prior art, various techniques are known for suppressing positive and negative going noise pulses in chips. Noise suppression circuits are shown generally in U.S. Pat. Nos. 3,816,762 and 3,898,482. Also, integrated circuit clamping circuits are shown in U.S. Pat. Nos. 3,188,499; 3,654,530; 3,816,762; 3,898,482; 4,027,177; 4,085,432; 4,178,521; 4,216,393; 4,239,989 and 4,131,928. Those prior art patents do not deal specifically with the concept of reducing effective package inductance by rerouting the high frequency noise currents for circulation near the top of the module. Rather, they deal with circuits to suppress noise rather than attempting to eliminate the noise components per se.

Reference is made to U.S. Pat. No. 4,398,106, entitled "On-Chip Delta-I Noise Clamping Circuit" granted Aug. 9, 1983 to Evan E. Davidson et al., and of common assignee herewith. Reference is also made to the IBM Technical Disclosure Bulletin publication "ΔI Suppressor" by G. E. Gersbach, Vol. 19, No. 1, June 1, 1976, page 30.

SUMMARY OF THE INVENTION

Given the deficiencies in the prior art, it is an object of this invention to create an on-chip impedance characteristic that interconnects the power supplies and off chip driver transistor allowing module currents to complete their loops on-chip.

Another object of this invention is to define a low impedance path for noise current that will flow near the top of a module and bypass a majority of package inductance.

Yet another object of this invention is to define an on-chip circuit that will reduce the Delta-I noise in MCM components.

These and other objects of this invention are accomplished by first defining an on-chip impedance characteristic connecting the power supplies and off-chip driver transistor that allow the module currents to complete their loops on-chip.

This is accomplished utilizing driver circuit means, a resistor and the characteristics of a P-N diode junction. The resistor and one or more diodes are connected in series between the positive and negative supply so as to forward bias the diode(s). The driver transistor collector is connected at the resistor-diode connection. The forward biased diode junction builds up an anode-cathode capacitance as a function of the forward bias current. This capacitance permits the transient currents to travel between the VC and ground power supplies and the driver transistor collector. This circuit also acts as a shunt current regulator to reduce the low frequency noise produced by the differences in VC current demand by the driver transistor from the high and low input signals.

If this circuit is placed between the VC and the GND power chip leads and connected to driver collector then when noise is generated by switching of the drivers there is a low impedance path for the noise current to flow near the top of the module. This effectively bypasses most of the package inductance causing a significant reduction in Delta-I noise. Moreover, the noise current flow now is directed through parallel via paths VC and GND to each chip thereby further reducing the effective inductance.

This invention will be described in greater detail by referring to the accompanying drawings and the description of the preferred embodiments which follow.

BRIEF DESCRIPTION OF THE DRAWINGS

FIG. 3 is a simplified schematic diagram of a conventional driver circuit and associated power supply wiring.

FIG. 4 is a simplified schematic diagram of the driver circuit and associated power supply wiring in accordance with the present invention.

FIG. 5 compares the current required from the board VC supply for the driver circuit when a pulse is applied to conventional circuitry as depicted in FIG. 3 and to circuitry in accordance with the invention as depicted in FIG. 4.

BEST MODE FOR CARRYING OUT THE INVENTION

Figure 1:
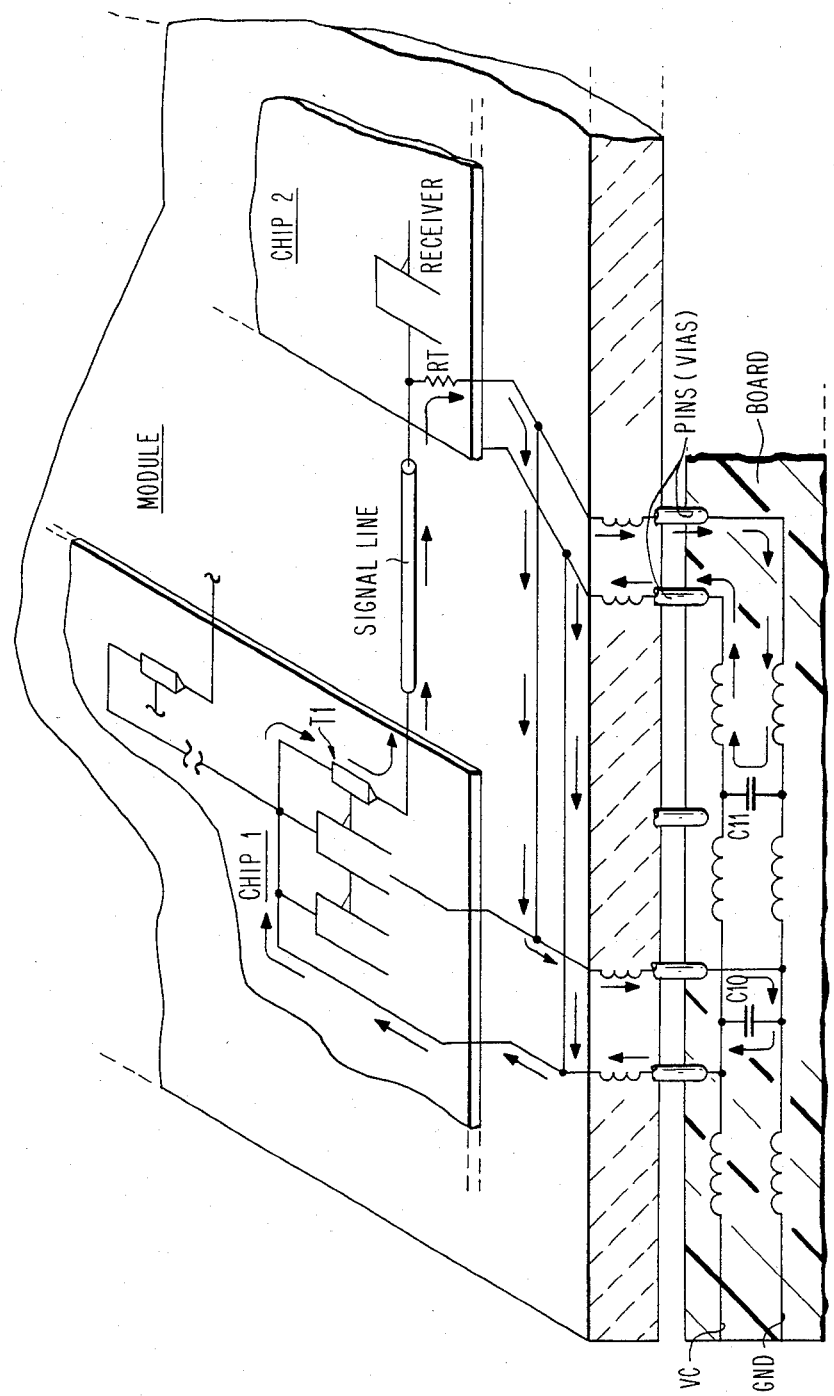
FIG. 1 is a schematic diagram showing conventional noise current flow paths between two chips on a module.
Figure 2:
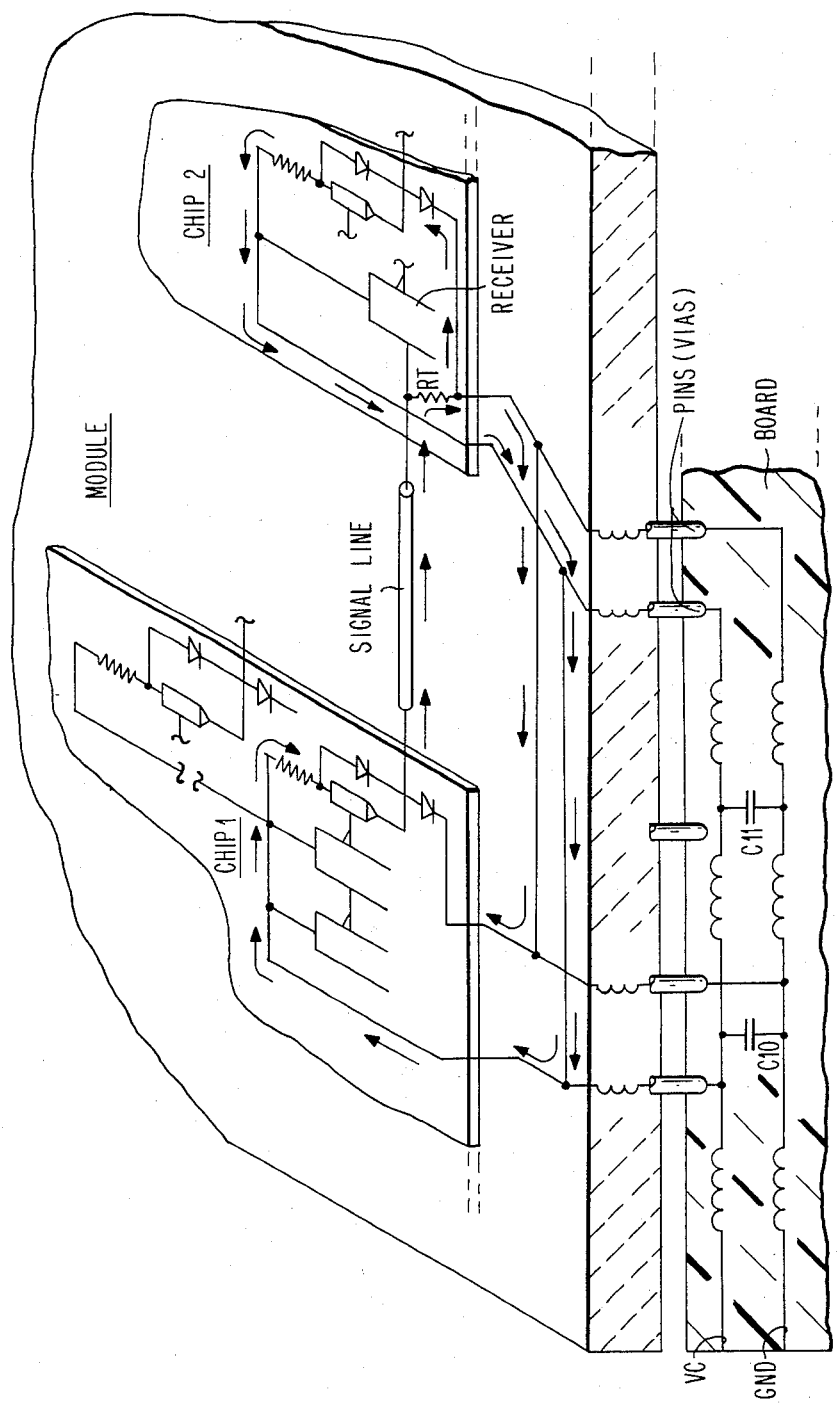
FIG. 2 is a schematic diagram showing noise current flow paths between two chips on a module in accordance with the present invention.

Referring now to FIG. 4, a simplified diagram of the bypassed emitter follower driver circuit of the present invention is illustrated. The bypassed emitter follower driver circuit includes a driver transistor T1, the collector of which is connected, at node A, to the anode of diode TS1 and current limiting resistor RC and the emitter of which is connected, at node C, to an off-chip signal line SL1. The base of driver transistor T1 is connected to an input signal. The input signal source is the output of another digital circuit or special circuit designed to provide proper input signals for transistor T1.

Diodes TS1 and TS2 are connected in series, such that the cathode of diode TS1 is connected to the anode of diode TS2. The cathode of diode TS2 is connected to module ground. Diodes TS1 and TS2 are preferably the base-collector junction of a transistor, which provides appreciable capacitance as a function of forward current flow.

Current limiting resistor, RC, is connected between chip VC and a node A. It will limit the amount of current to diodes TS1 and TS2.

Inductor L1 connects the chip VC to the board VC, while inductor L2 connects the chip ground to the board ground. These two inductors are the effective wiring inductance to the board supply of VC and ground. Resistor RT is connected between node B and chip ground. It is the terminating impedance for the signal line SL1 which is connected between node C, the driver transistor T1 emitter, and node B. Resistor RT is located on another chip.

Operation of the circuit for an active driver shown in FIG. 4 will now be described. Initially the input signal at the base of driver transistor T1 is low, so that the collector current of transistor T1 is low supplying only the small amount of current for terminating resistor RT. Diodes TS1 and TS2 are forward biased, clamping the voltage at node A at two forward diode drops above chip ground. The current through the diodes TS1 and TS2 is determined by resistor RC, the diode characteristics of diodes TS1 and TS2 and the voltage across the series connected resistor RC and diodes TS1 and TS2 and the small amount of current required by driver transistor T1 for terminating resistor RT. It should be noted that the current through resistor RC is the sum of transistor T1 collector current and diodes TS1 and TS2 biasing current.

As is well known to those having skill in the semiconductor art, a diode has two types of capacitance associated therewith. The first capacitance is generally referred to as depletion capacitance and is due to the charge depletion at the PN diode junction. The depletion capacitance is dominant under reverse bias conditions. The second capacitance is referred to as the diffusion or charge storage capacitance which arises from the lagging behind of voltage as current charges, due to charge storage effects. The diffusion or charge storage capacitance is dominant under forward bias conditions, and is an exponential function of the current through the junction.

Since diodes TS1 and TS2 are forward biased, the diffusion or charge storage capacitance dominates. Diodes TS1 and TS2 are preferably each a base-collector junction but could also be a base-emitter junction, or a base-collector junction is series with a base-emitter junction.

When the input to driver transistor T1 goes high, nodes C and B go high. This increases the current transistor T1 needs to supply terminating resistor RT, thus increasing the current through resistor RC. This lowers the voltage at node A. As the voltage at node A drops, diodes TS1 and TS2 provide two important functions. First, the diode current-voltage characteristics reduce the current through the two diodes as node A voltage drops, switching the current to transistor T1. The current previously going through diodes TS1 and TS2 now goes through transistor T1. Diodes TS1 and TS2 are regulating the current through RC. As the voltage drops at node A the ability of diodes TS1 and TS2 to regulate the current through RC diminishes. This shunt regulator effect minimizes the changes in IR drop for the VC supply wiring and ground supply wiring. Since the off chip drivers (such as transistor T1) change state infrequently, as compared to the speed at which the off chip driver goes from a high level to a low level, the shunt regulator effect will reduce the low frequency VC supply and ground supply wiring IR drop.

The second function of transistor junctions TS1 and TS2, as node A voltage drops, is to provide bypass capacitance. As explained previously, a forward biased diode forms an anode-cathode capacitance as a function of its forward current. This capacitance becomes large as the current is increased. This phenomena is used in the circuit to provide a bypass to ground capacitance for node A. Thus, as node A voltage drops the diode junction capacitance provides an AC current path from ground, reducing the transient current through resistor RC. This provides AC return path for the transient current in the chip ground supply.

When the signal "in" is at an Up level, transistor T1 is providing DC current to the off chip circuit. The diode junctions of TS1 and TS2 are off or at a very low current level, providing no function in the circuit. This DC condition causes no transient conditions to the chip power supply.

When the input signal goes from a high level to a low level another transient condition exists. The collector current of driver transistor T1 is reduced, since the voltage at RT is reduced. The current reduction through resistor RC causes node A to rise, turning on diodes TS1 and TS2. The forward bias diode characteristics of TS1 and TS2 maintains the resistor current. This minimizes the current changes to the chip VC supply and chip ground supply, providing the shunt regulator effect described previously. As diodes TS1 and TS2 become more forward biased, the capacitive junction properties increase, providing a better AC return path for the transients on both VC supply and ground supply. This allows the AC transient currents to be confined to the chip level, minimizing the transient currents which must return to the module VC and ground supplies for decoupling.

FIG. 5 compares the current through inductor L1 of FIG. 3, the uncompensated driver circuit, to the current through inductor L1 of FIG. 4, the compensated driver circuit. From time 0 to time 2 the inputs of the two circuits are steady state. The current is higher for the compensated circuit since the diodes TS1 and TS2 are conducting current. The diodes are forward biased and have large anode-cathode capacitance characteristics. At time 2 the input signal to both circuits (FIGS. 3 and 4) goes high. Although not described previously, signal line SL1 in both FIGS. 3 and 4 has capacitive characteristics which increases the transient VC supply and ground supply currents. At time 4, the uncompensated circuit provides a 4.4 mA ($\Delta I$) change in current from the VC board supply, which produces a voltage change at the chip VC supply equal to $L1 \Delta I_{VC}/\Delta T$. The compensated circuit during this transition is capacitively coupling the transient from the ground supply to the driver transistor collector using the capacitance of diodes TS1 and TS2 in FIG. 4. At time 4, the compensated circuit provides a 2.3 mA ($\Delta I$) change in current from the VC board supply, which produces a voltage change at the chip VC supply equal to $L1 \Delta I_{VC comp}/\Delta T$. Since the compensated circuit has a smaller $\Delta I$ it will have a smaller voltage change at the chip VC supply.

At time 11, FIG. 5, the input signal goes to a low level. The current required by both circuits decrease. The current for the uncompensated circuit goes to 0mA at time 12 due to the capacitive characteristics of signal line SL1. Resistor RT in FIG. 3 must discharge the capacitance of signal line SL1. At time 14, the capacitance is discharged and driver transistor T1 turns on. The $\Delta I$ for this negative going transition at time 12 is 2.3 mA. The compensated circuit is also driving the signal line SL1 with its capacitive characteristics. At time 12 it also demands less current from the VC supply. However, as it demands less current, diodes TS1 and TS2 in FIG. 4 become forward biased, conducting the transient current to ground supply as described previously. This results in a smaller $\Delta I$ of 1 mA.

Figure 6:
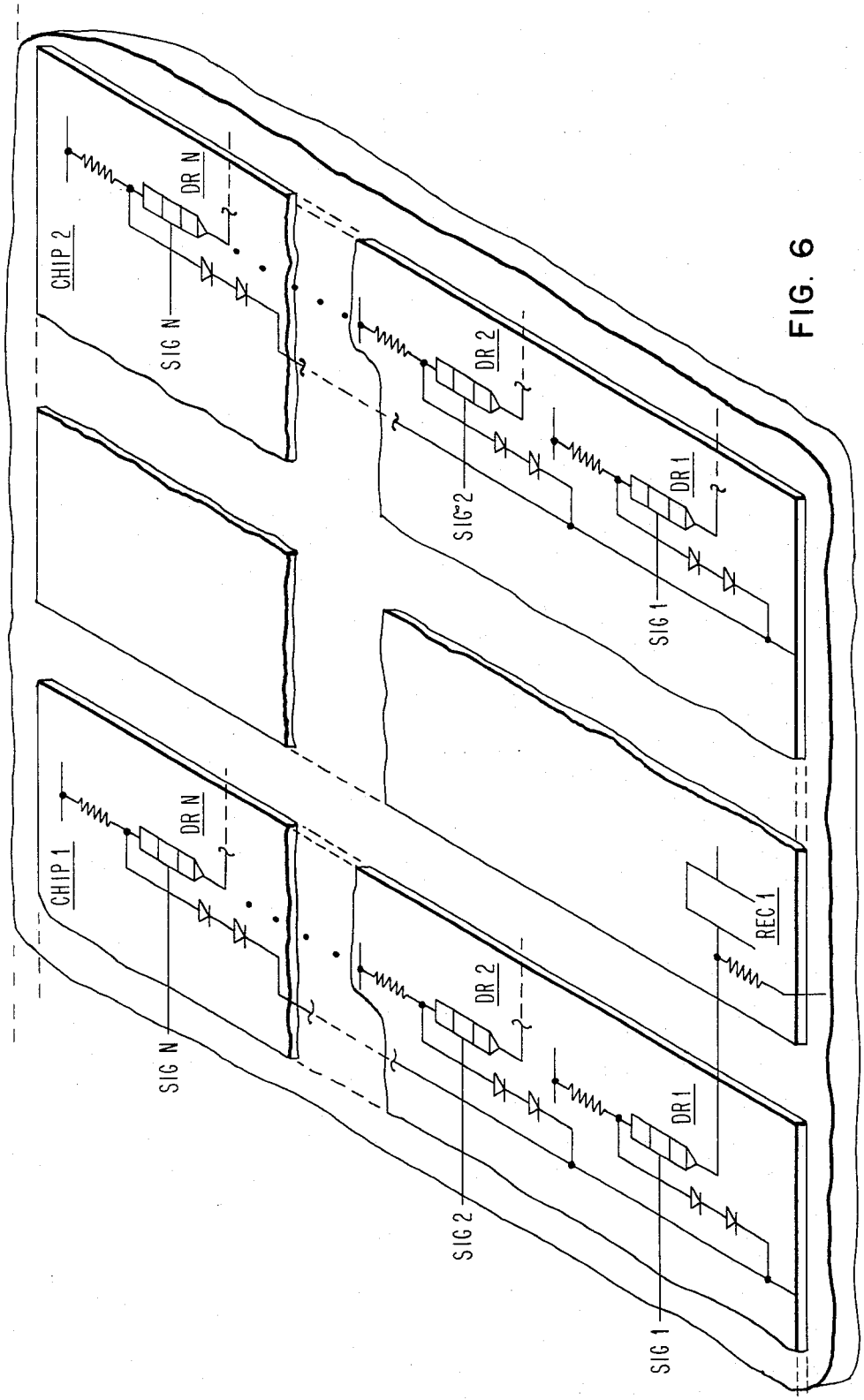
FIG. 6 is a schematic drawing of two representative chips on a module, in accordance with the invention, and wherein each chip may have a plurality of off-chip driver circuits and a plurality of receiver circuits.

The operation of the circuit for an inactive driver will now be described. FIG. 6 shows two typical chips mounted on a module. Both chip 1 and chip 2 have a number of compensated drivers on each chip. The compensated driver is the type shown in FIG. 4.

The drivers on each chip can be described as active, an input transition applied to the input, or described as inactive, the input is at a DC level.

Operation of the active driver was described previously. The inactive driver can have one of two inputs. Referring to FIG. 4, a high level input to driver transistor T1 pulls node A low as described previously. Diodes TS1 and TS2 although forward biased, conduct very little current and the anode to cathode capacitance is relatively small. In this state, the compensating circuit has little impact on decoupling the VC supply to the ground supply other than as previously described for an active driver. When the input to driver transistor T1 is low, diodes TS1 and TS2 are forward biased and the anode to cathode capacitance is high. In this state the series connection of resistor RC and diodes TS1 and TS2 provide a low impedance path for transients between the VC supply and ground supply. Although these circuits are not part of the active driver circuit they are included in chip VC to ground supply decoupling network and aid in keeping the transient currents at the chip level.

While the invention has been particularly shown and described with reference to a preferred embodiment thereof, it will be understood by those skilled in the art that various changes in form and details may be made therein without departing from the spirit and scope of the invention.

We claim:

1. In an integrated circuit packaging structure, at least a first integrated circuit chip, said first integrated circuit chip being contained on said packaging structure and having off-chip driver circuit means, at least a second integrated circuit chip, said second integrated circuit chip being contained on said packaging structure and having chip receiver circuit means, said integrated circuit packaging structure including electrical connection means for connecting said off-chip driver circuit means of said first chip to said chip receiver circuit means of said second chip, said off-chip driver circuit means including noise suppression circuit means, said integrated circuit packaging structure being further characterized as follows:

said off-chip driver circuit means of said first chip including an output transistor having a collector, base and emitter;

a first package inductance and a resistor serially connected between said collector of said output transistor and a first potential source;

said base of said output transistor being adapted to receive an input signal;

said electrical connection means of said integrated circuit packaging structure having at least a first signal line and a first reference potential line for providing electrical connection between said first and second chips;

said emitter of said output transistor of said off-chip driver circuit means of said first integrated circuit chip being connected via said first signal line of said electrical connection means to a first terminal of said receiver circuit means of said second integrated circuit chip;

said noise suppression circuit means comprising a serial two terminal non-linear impedance, a first terminal of said serial two terminal non-linear impedance being connected to said collector of said output transistor contained on said first chip; and a second package inductance, said second package inductance being serially connected between a second potential source and via said first reference potential line of said electrical connection means to said second terminal of said serial two terminal non-linear impedance and a second terminal of said receiver circuit means contained on said second chip.

2. In an integrated circuit packaging structure, as recited in claim 1 wherein said two terminal non-linear impedance is a semiconductor device providing non-linear essentially capacitive impedance.

3. In an integrated circuit packaging structure, as recited in claim 2, wherein said two terminal non-linear impedance is at least one diode.

4. In an integrated circuit packaging structure, as recited in claim 2, wherein said two terminal non-linear impedance comprises first and second serially connected diodes.

5. In an integrated circuit packaging structure, as recited in claim 2 wherein said two terminal non-linear impedance is provided by at least one base collector junction of a bipolar transistor.

6. In an integrated circuit packaging structure, as recited in claim 2, wherein said two terminal non-linear impedance comprises first and second serially connected base collector junctions of first and second bipolar transistors.

7. In an integrated circuit packaging structure, as recited in claims 2, 3, 4, 5 or 6 wherein said receiver circuit means contained on said second chip provides a substantially resistive terminating impedance between its first and second terminals.

8. In an integrated circuit packaging structure, as recited in claim 2, wherein said integrated circuit packaging structure contains a plurality of integrated circuit chips, each of said integrated circuit chips including off-chip driver circuits and receiver circuits and at least the majority of said chips including noise suppression circuit means.

* * * * *